United States Patent
Liu et al.

(10) Patent No.: US 10,104,778 B2
(45) Date of Patent: Oct. 16, 2018

(54) FLEXIBLE PRINTED CIRCUIT BOARD STRUCTURE

(71) Applicant: UNIFLEX Technology Inc., Taichung (TW)

(72) Inventors: Yi-Chun Liu, New Taipei (TW);
Pei-Hao Hung, Taichung (TW);
Wen-Chien Hsu, Taoyuan (TW);
Meng-Huan Chia, Taichung (TW);
Min-Ming Tsai, Taichung (TW);
Shan-Yi Tseng, Taoyuan (TW);
Yuan-Chih Lee, Taoyuan (TW)

(73) Assignee: UNIFLEX Technology Inc., Taichung (TW)

( * ) Notice: Subject to any disclaimer, the term of this patent is extended or adjusted under 35 U.S.C. 154(b) by 0 days.

(21) Appl. No.: 15/438,634

(22) Filed: Feb. 21, 2017

(65) Prior Publication Data
US 2018/0146552 A1    May 24, 2018

(30) Foreign Application Priority Data
Nov. 21, 2016  (TW) .............................. 105138031 A

(51) Int. Cl.
*H05K 1/18*  (2006.01)
*H05K 1/02*  (2006.01)

(52) U.S. Cl.
CPC ............ *H05K 1/189* (2013.01); *H05K 1/028* (2013.01); *H05K 2201/10106* (2013.01); *H05K 2201/10151* (2013.01)

(58) Field of Classification Search
USPC .................................................. 361/749, 748
See application file for complete search history.

(56) References Cited

U.S. PATENT DOCUMENTS

| 2012/0182015 | A1* | 7/2012 | Driemel | ............. G01R 33/3685 324/322 |
| 2012/0307461 | A1* | 12/2012 | Liskow | .................. H05K 3/281 361/749 |
| 2015/0198302 | A1* | 7/2015 | Liang | ..................... H01H 9/182 362/23.03 |

FOREIGN PATENT DOCUMENTS

| CN | 1805652 | 4/2012 |
| CN | 102237657 | 6/2013 |
| CN | 104902670 | 9/2015 |
| TW | 353853 | 3/1999 |

OTHER PUBLICATIONS

"Office Action of Taiwan Counterpart Application", dated Mar. 16, 2017, p. 1-p. 3.

* cited by examiner

*Primary Examiner* — Andargie M Aychillhum
(74) *Attorney, Agent, or Firm* — JCIPRNET

(57) ABSTRACT

A flexible printed circuit board structure includes a spiral flexible printed circuit board and a protection cover capable of providing functions of extensibility and retractility. The spiral flexible printed circuit board includes a flexible substrate curling up spirally, a patterned circuit layer and a plurality of electrical contacts. The patterned circuit layer is disposed on the flexible substrate. The electrical contacts are disposed on an end of the flexible substrate and electrically connected to the patterned circuit layer. The protection cover at least covers a part of the spiral flexible printed circuit board.

6 Claims, 2 Drawing Sheets

FLEXIBLE PRINTED CIRCUIT BOARD STRUCTURE

CROSS-REFERENCE TO RELATED APPLICATION

This application claims the priority benefit of Taiwan application serial no. 105138031, filed on Nov. 21, 2016. The entirety of the above-mentioned patent application is hereby incorporated by reference herein and made a part of this specification.

BACKGROUND

Technical Field

The present disclosure generally relates to a flexible printed circuit board structure. More particularly, the present disclosure relates to flexible printed circuit board structure curling up spirally.

Description of Related Art

In current information society, people are becoming increasingly dependent on electronic products. To address the demands of high speed, high performance, light-weight, thin and small in size of current electronic products, flexible printed circuit (FPC) boards that are bendable have been gradually applied in various electronic devices, such as, notebook PCs, smart phones, tablet PCs, digital cameras, printers, etc. It is noted that the FPC boards not only may be adopted for electrical connection, but also may be adopted for carrying chips or other electronic components.

However, when being applied to devices with repeatedly bending requirements, e.g. robot arms, FPC boards still encounter problems of tangling or knotting. Moreover, when the devices such as robot arms is bent, the FPC boards are usually in a folded state. If the FPC boards is in such folded state repeatedly over a long period of time, the circuits on the FPC boards may be damaged, which shortens lifespans of the FPC boards.

SUMMARY

Accordingly, the present disclosure is directed to a flexible printed circuit board structure, which is curling up spirally and capable of providing protection to the circuit on the flexible printed circuit board and providing the function of extensibility and retractility, so as to elongate the lifespan of the flexible printed circuit board structure.

The present disclosure provides a flexible printed circuit board structure includes a spiral flexible printed circuit board and a protection cover capable of providing functions of extensibility and retractility. The spiral flexible printed circuit board includes a flexible substrate curling up spirally, a patterned circuit layer and a plurality of electrical contacts. The patterned circuit layer is disposed on the flexible substrate. The electrical contacts are disposed on an end of the flexible substrate and electrically connected to the patterned circuit layer. The protection cover at least covers a part of the spiral flexible printed circuit board.

According to an embodiment of the present disclosure, the protection cover comprises a protection sleeve, which is sleeved on the spiral flexible printed circuit board, and the spiral flexible printed circuit board curls up spirally in the protection sleeve.

According to an embodiment of the present disclosure, the protection sleeve is a flexible protection sleeve with characteristics of extensibility and retractility.

According to an embodiment of the present disclosure, the protection sleeve is a non-flexible protection sleeve.

According to an embodiment of the present disclosure, the flexible printed circuit board structure further includes a plurality of light emitting components disposed on the flexible substrate and electrically connected to the patterned circuit layer.

According to an embodiment of the present disclosure, the protection sleeve is a transparent protection sleeve.

According to an embodiment of the present disclosure, the protection cover exposes the electrical contacts.

According to an embodiment of the present disclosure, the protection cover includes a spiral protection cover, the spiral flexible printed circuit board is attached onto the spiral protection cover to curl up spirally with the spiral protection cover.

According to an embodiment of the present disclosure, the flexible printed circuit board structure further includes a plurality of light emitting components disposed on the flexible substrate and electrically connected to the patterned circuit layer.

According to an embodiment of the present disclosure, the spiral protection sleeve is a transparent spiral protection sleeve.

According to an embodiment of the present disclosure, the flexible substrate includes a top surface and a bottom surface opposite to the top surface, the patterned circuit layer and the electrical contacts are disposed on the top surface, and the spiral flexible printed circuit board is attached to the spiral protection cover via the bottom surface.

According to an embodiment of the present disclosure, the flexible printed circuit board structure further includes a sensing component disposed on the flexible substrate and electrically connected to the patterned circuit layer.

In light of the foregoing, in the flexible printed circuit board structure of the disclosure, the spiral flexible printed circuit board curls up spirally, which shortens the length thereof and reduces the required configuration space. Moreover, when the flexible printed circuit board structure is applied to devices with repeatedly bending requirement, the problems of the flexible printed circuit board structure being tangled, knotted, folded, etc., may be effectively avoided, so as to elongate the lifespan of the flexible printed circuit board structure. Furthermore, the protection cover may provide the spiral flexible printed circuit board with protection, so as to enhance the structural strength of the spiral flexible printed circuit board and prevent the spiral flexible printed circuit board from external damage. Therefore, the flexible printed circuit board structure is capable of effectively improving the reliability thereof, and further elongate the lifespan of the flexible printed circuit board structure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
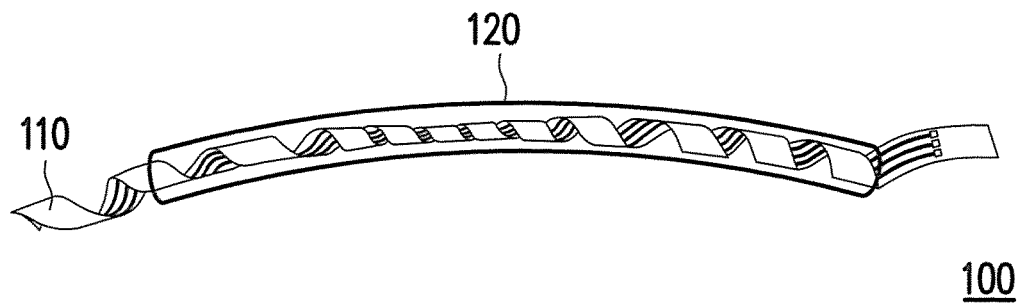
FIG. 1 illustrates a schematic view of a flexible printed circuit board structure according to an embodiment of the disclosure.

In the following detailed description of the preferred embodiments, reference is made to the accompanying drawings which form a part hereof, and in which are shown by way of illustration specific embodiments in which the disclosure may be practiced. In his regard, directional terminology, such as "top," "bottom," "front," "back," etc., is used with reference to the orientation of the Figure(s) being described. The components of the disclosure can be positioned in a number of different orientations. As such, the directional terminology is used for purposes of illustration and is in no way limiting. Accordingly, the drawings and descriptions will be regarded as illustrative in nature and not as restrictive. Wherever possible, the same reference numbers are used in the drawings and the description to refer to the same or like parts.

Figure 2:
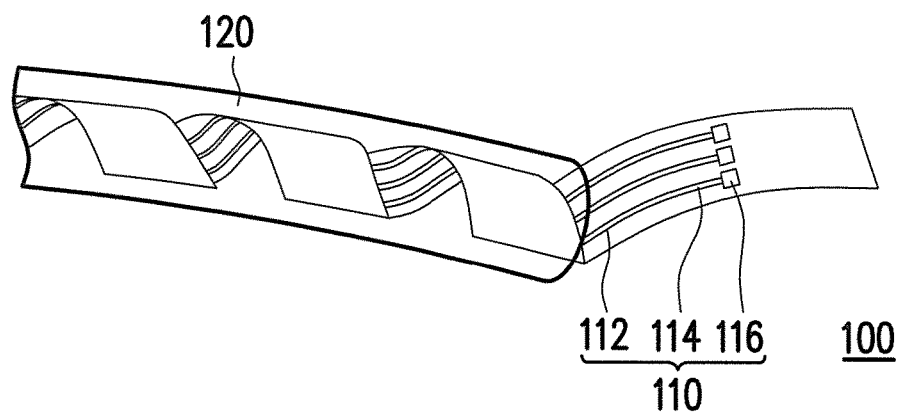
FIG. 2 illustrates a partial enlarged view of the flexible printed circuit board structure in FIG. 1.

FIG. 1 illustrates a schematic view of a flexible printed circuit board structure according to an embodiment of the disclosure. FIG. 2 illustrates a partial enlarged view of the flexible printed circuit board structure in FIG. 1. The flexible printed circuit (FPC) board structure 100 includes a spiral FPC board 110 and a protection cover 120. The spiral FPC board 110 includes a flexible substrate 112 curling up spirally, a patterned circuit layer 114 and a plurality of electrical contacts 116. In the present embodiment, the material of the flexible substrate 112 includes flexible materials such as polyimide (PI), polyamide (PA), polyetherimide (PEI), polyethylene terephthalate (PET), liquid crystal polymer (LCP), etc. Generally, in heat tolerance or accessibility point of view, polyimide may be adopted as the material of the flexible substrate 112. Certainly, the disclosure is not limited thereto. The patterned circuit layer 114 may be disposed on the flexible substrate 112 by, for example, printing method. The electrical contacts 116 are disposed on an end of the flexible substrate 112 and electrically connected to the patterned circuit layer 114. The protection cover 120 at least covers a part of the spiral FPC board 110.

Specifically, the protection cover 120 may at least expose the electrical contacts 116. In the present embodiment, the FPC board structure 100 may further include an electrical connector disposed on an end of the spiral FPC board 110 and electrically connected to the electrical contacts 116. Accordingly, the FPC board structure 100 may be electrically connected to other electronic components through the exposed electrical contacts 116 and/or the electrical connector. In the present embodiment, a width of the spiral FPC board 110 may substantially range between 100 μm and 150 μm. Certainly, the numerical range of the present embodiment is merely for illustration, and the disclosure is not limited thereto.

With such configuration, the spiral FPC board 110 curls up spirally, which effectively shortens the length thereof and reduces the required configuration space. Moreover, when the FPC board structure 100 is applied to devices with repeatedly bending requirement, the problems of the FPC board structure 100 being tangled, knotted, folded, etc., may be effectively avoided, so as to elongate the lifespan of the FPC board structure 100. Furthermore, the protection cover 120 may provide the spiral FPC board 110 with protection, so as to enhance the structural strength of the spiral FPC board 110 and prevent the spiral FPC board 110 from external damage. Therefore, the FPC board structure 100 is capable of effectively improving the reliability of the FPC board structure 100, and further elongate the lifespan of the FPC board structure 100.

In the present embodiment, the protection cover 120 may be a protection sleeve as shown in FIG. 1, which is sleeved on the spiral FPC board 110, and the spiral FPC board 110 curls up spirally in the protection sleeve 120. To be more specific, the figure of the spiral FPC board 110 may be formed by, for example, winding method, and then the spiral FPC board 110 penetrates through the protection sleeve 120 to form the FPC board structure 100 as shown in FIG. 1.

In the present embodiment, the protection sleeve 120 is a flexible protection sleeve, such that the FPC board structure 100 may be bent and stretched arbitrarily accordingly to the spiral FPC board 110. The protection sleeve 120 has functions of extensibility and retractility, such that the FPC board structure 100 has functions of extensibility and retractility. In addition, the FPC board structure 100 may further include at least one electronic component 118, which is disposed on the flexible substrate 112 and electrically connected to the patterned circuit layer 114. In the present embodiment, the electronic component 118 may be a sensing component. Specifically, the electronic component 118 may be, for example, a pressure sensing component, a speed sensing component or a temperature sensing component, etc. Accordingly, when the FPC board structure 100 of the present embodiment is applied to an electronic device with the need of operation force, speed or temperature control, such as a robot arm, the electronic device may control the operation condition thereof through the sensing component on the FPC board structure 100.

In addition, in an embodiment of the disclosure, the FPC board structure 100 may include a plurality of light emitting components, which are disposed on the flexible substrate 112 and electrically connected to the patterned circuit layer 114. In other words, at least one electronic component 118 of the present embodiment may be a plurality of light emitting components. Under such configuration, the protection sleeve 120 is a transparent protection sleeve. Namely, the protection sleeve 120 may be formed by a material with diaphaneity. With such configuration, the FPC board structure 100 may be applied for decoration or illuminance purpose, and adapted to be bent into variety of shapes according to requirements of users or products.

In an embodiment of the disclosure, the protection sleeve 120 is a non-flexible protection sleeve. Namely, the protection sleeve 120 is formed by non-flexible material. In the present embodiment, the non-flexible protection sleeve 120 may be configured to enhance the structural strength of the FPC board structure 100. In other embodiment, the protection sleeve 120 may further provide waterproof function. For example, the FPC board structure 100 may include both of the flexible protection sleeve 120 and the non-flexible protection sleeve 120, which are sleeved on different part of the spiral FPC board 110 respectively, so as to provide different protection according to different needs. For example, in the present embodiment, the flexible protection sleeve 120 may be sleeved on the part of the FPC board structure 100 requiring bending ability, and the non-flexible protection sleeve 120 may be sleeved on the part of the FPC board structure 100 requiring stronger structural strength. Furthermore, a waterproof protection sleeve may be sleeved on the part of the FPC board structure 100 requiring waterproof function. Certainly, the present embodiment is merely for illustration, and the disclosure is not limited thereto.

Figure 3:
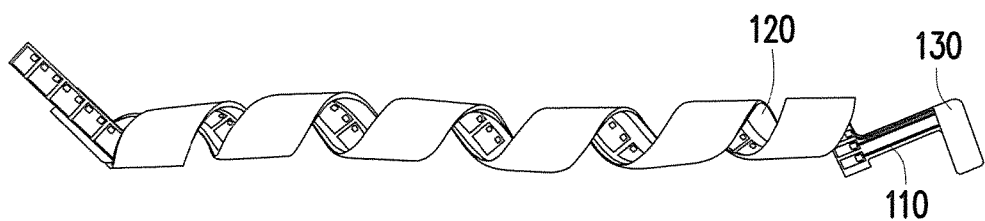
FIG. 3 illustrates a schematic view of a flexible printed circuit board structure according to another embodiment of the disclosure.
Figure 4:
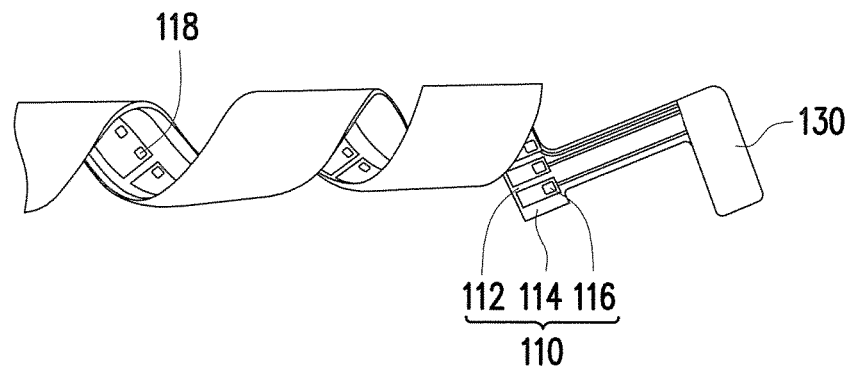
FIG. 4 illustrates a partial enlarged view of the flexible printed circuit board structure in FIG. 3.

FIG. 3 illustrates a schematic view of a flexible printed circuit board structure according to another embodiment of the disclosure. FIG. 4 illustrates a partial enlarged view of the flexible printed circuit board structure in FIG. 3. It is noted that the FPC board structure 100a shown in FIG. 3 and FIG. 4 contains many features same as or similar to the FPC board structure 100 disclosed earlier with FIG. 1 and FIG. 2. For purpose of clarity and simplicity, detail description of same or similar features may be omitted, and the same or similar reference numbers denote the same or like components. The main differences between the FPC board structure 100a and the FPC board structure 100 are described as follows.

In the present embodiment, the protection cover 120 may be a spiral protection cover. The spiral FPC board 110 is attached to the spiral protection cover 120 to curl up spirally with the spiral protection cover 120. In detail, the flexible substrate 112 includes a top surface and a bottom surface opposite to the bottom surface. The patterned circuit layer 114 and the electrical contacts 116 are disposed on the top surface of the flexible substrate 112, and the spiral FPC board 110 is attached onto the spiral protection cover 120 via the bottom surface of the flexible substrate 112. Therefore, the spiral protection cover 120 may expose the patterned circuit layer 114 and the electrical contacts 116 of the spiral FPC board 110 and enhance the structural strength of the spiral FPC board 110. Accordingly, the FPC board structure 100a may be electrically connected to other electronic components through the exposed electrical contacts 116.

In the present embodiment, the FPC board structure 100a may further include at least one electronic component 118, which is disposed on the flexile substrate 112 and electrically connected to the patterned circuit layer 114. In the present embodiment, the electronic component 118 may be a sensing component. In detail, the electronic component 118 may be, for example, a pressure sensing component, a speed sensing component or a temperature sensing component, etc. Accordingly, when the FPC board structure 100a of the present embodiment is applied to an electronic device with the need of operation force, speed or temperature control such as a robot arm, the electronic device may control the operation condition thereof through the sensing component on the FPC board structure 100a, so as to improve the operational accuracy of the electronic device using the FPC board structure 100a.

In addition, in an embodiment of the present disclosure, the FPC board structure 100a may include a plurality of light emitting components, which are disposed on the flexible substrate 112 and electrically connected to the patterned circuit layer 114. Namely, at least one electronic component 118 of the present embodiment may be a plurality of light emitting components. With such configuration, the FPC board structure 100a may be applied for decoration or illuminance purpose, and adapted to be bent into variety of shapes according to requirements of users or products. In the present embodiment, the FPC board structure 100a may further include an electrical connector 130 disposed at an end of the spiral FPC board 110 and electrically connected to the electrical contacts 116. Accordingly, the FPC board structure 100 may be electrically connected to other electronic components through the exposed electrical contacts 116 and/or the electrical connector 130.

In sum, in the FPC board structure of the disclosure, the spiral FPC board curls up spirally, which effectively shortens the length thereof and reduces the required configuration space. Moreover, when the FPC board structure is applied to devices with repeatedly bending requirement, the problems of the FPC board structure being tangled, knotted, folded, etc., may be effectively avoided, so as to elongate the lifespan of the FPC board structure. Furthermore, the protection cover may provide the spiral FPC board with protection, so as to enhance the structural strength of the spiral FPC board and prevent the spiral FPC board from external damage. Therefore, the FPC board structure is capable of effectively improving the reliability thereof, and further elongate the lifespan of the FPC board structure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A flexible printed circuit board structure, comprising:
   a spiral flexible printed circuit board, comprising a flexible substrate curling up spirally, a patterned circuit layer and a plurality of electrical contacts, wherein the patterned circuit layer is disposed on the flexible substrate, the electrical contacts is disposed on an end of the flexible substrate and electrically connected to the patterned circuit layer;
   a sensing component, mounted on the flexible substrate and electrically connected to the patterned circuit layer; and
   a protection cover, at least covers a part of the spiral flexible printed circuit board, wherein the protection cover comprises a protection sleeve, which is sleeved on the spiral flexible printed circuit board, and the spiral flexible printed circuit board curls up spirally in the protection sleeve.

2. The flexible printed circuit board structure as claimed in claim 1, wherein the protection sleeve is a flexible protection sleeve with characteristics of extensibility and retractility.

3. The flexible printed circuit board structure as claimed in claim 1, wherein the protection sleeve is a non-flexible protection sleeve.

4. The flexible printed circuit board structure as claimed in claim 1, further comprising a plurality of light emitting components disposed on the flexible substrate and electrically connected to the patterned circuit layer.

5. The flexible printed circuit board structure as claimed in claim 4, wherein the protection sleeve is a transparent protection sleeve.

6. The flexible printed circuit board structure as claimed in claim 1, wherein the protection cover exposes the electrical contacts.

* * * * *